(12) United States Patent  
Borden et al.

(10) Patent No.: US 7,820,472 B2
(45) Date of Patent: Oct. 26, 2010

(54) METHOD OF FORMING FRONT CONTACTS TO A SILICON SOLAR CELL WITHOUT PATTERNING

(75) Inventors: Peter Borden, San Mateo, CA (US); John Dukovic, Palo Alto, CA (US); Li Xu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 148 days.

(21) Appl. No.: 12/291,917

(22) Filed: Nov. 13, 2008

(65) Prior Publication Data

US 2010/0120191 A1    May 13, 2010

(51) Int. Cl.
    *H01L 21/00*    (2006.01)
(52) U.S. Cl. .................. 438/73; 438/665; 438/678; 136/261; 205/135; 205/107
(58) Field of Classification Search .......... 257/E31.127; 438/57, 61, 73, 98, 71, 665, 964, 678; 136/261; 205/102, 103, 123, 135, 107
See application file for complete search history.

(56) References Cited

U.S. PATENT DOCUMENTS 3,291,871 A * 12/1966 Francis ..................... 264/1.31
5,591,565 A * 1/1997 Holdermann et al. ......... 438/98
6,162,658 A * 12/2000 Green et al. ................. 438/57

FOREIGN PATENT DOCUMENTS

| JP | 05-218466 | 8/1993 |
| JP | 05-243592 | 9/1993 |
| KR | 10-1998-0068248 | 10/1998 |

OTHER PUBLICATIONS

International Search Report. PCT/US2009/064121 dtd. Jun. 21, 2010.

* cited by examiner

*Primary Examiner*—Davienne Monbleau
*Assistant Examiner*—Matthew Reames
(74) *Attorney, Agent, or Firm*—Patterson & Sheridan, LLP (57) ABSTRACT

A method for forming front contacts on a silicon solar cell which includes texture etching the front surface of the solar cell, forming an antireflective layer over the face, diffusing a doping material into the face to form a heavily doped region in valleys formed during the texture-etching of the face, depositing an electrically conductive material on the heavily doped regions in the valleys and annealing the solar cell.

22 Claims, 7 Drawing Sheets
(1 of 7 Drawing Sheet(s) Filed in Color)

METHOD OF FORMING FRONT CONTACTS TO A SILICON SOLAR CELL WITHOUT PATTERNING

FIELD OF THE INVENTION

This invention relates generally to photovoltaic silicon solar cells and more particularly to the formation of contacts on the front radiation-receiving side of the cell.

BACKGROUND OF THE INVENTION

Photovoltaic solar cells essentially comprise a semiconductor substrate of one conductivity type having a shallow p-n junction formed adjacent to the front surface thereof. The cells require electrical contacts to their front and rear sides to obtain electrical current from the cells when they're exposed to solar radiation. The contact on the front of the solar cell is generally made in the form of a grid comprising a plurality of narrow elongated parallel fingers that extend in one direction and at least one but in most cases two elongate bus bars that intersect the fingers at a right angle. The width, number and spacing of the fingers are arranged so as to expose an optimum area of the front surface of the cell to incident solar relation.

The prior art methods of forming a grid electrode require patterning of the electrode grid on the front surface. One method is to screen print electrodes over a deposited silicon nitride layer, which is used to form the anti-reflection (AR) coating. The screen printed electrode grid, which is typically formed from a silver-filled paste, dissolves the silicon nitride when fired, forming a contact. Such a method forms lines on the order of 100 μm wide that blocks a significant portion of the incident sunlight, and the contact alloys to a depth of a few thousand angstroms. The wide lines and deep contacts are suitable for lower efficiency cells, but not for high efficiency devices that need narrow, shallow contacts. For these devices, patterning usually involves masking, by way of example, photolithography and etching to provide openings in the anti-reflective coating provided on the front surface of the solar cell so that metalized contacts can be applied directly to the front surface of the solar cell. Such masking adds to the time and cost of producing a solar cell, and is often not economically viable.

There is therefore a need for a contact forming technique for narrow, shallow lines that can be integrated into a mass production manufacturing process in which the contact forming technique does not utilize patterning and thus increases the speed and reduces the complexity with which the contacts are formed.

SUMMARY OF THE INVENTION

A method of forming front contacts on a silicon solar cell comprising texture etching the front surface of the solar cell, applying an antireflective coating there-over, applying doping material thereto, annealing to diffuse the doping material into the front surface to provide a layer of opposite conductivity type and applying a contact metal material to the valleys formed by the texture etching.

Embodiment of the invention may further provide a method for forming electrically conductive paths on the face of a crystalline solar cell without patterning comprising texture etching the face of the solar cell to provide peaks and valleys, plating an electrically conductive material onto the texture-etched face, and reversing the plating current to etch back the plated material from the peaks but not from the valleys of the texture-etched face.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The patent or application file contains at least one drawing executed in color. Copies of this patent or patent application publication with color drawing(s) will be provided by the Office upon request and payment of the necessary fee.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
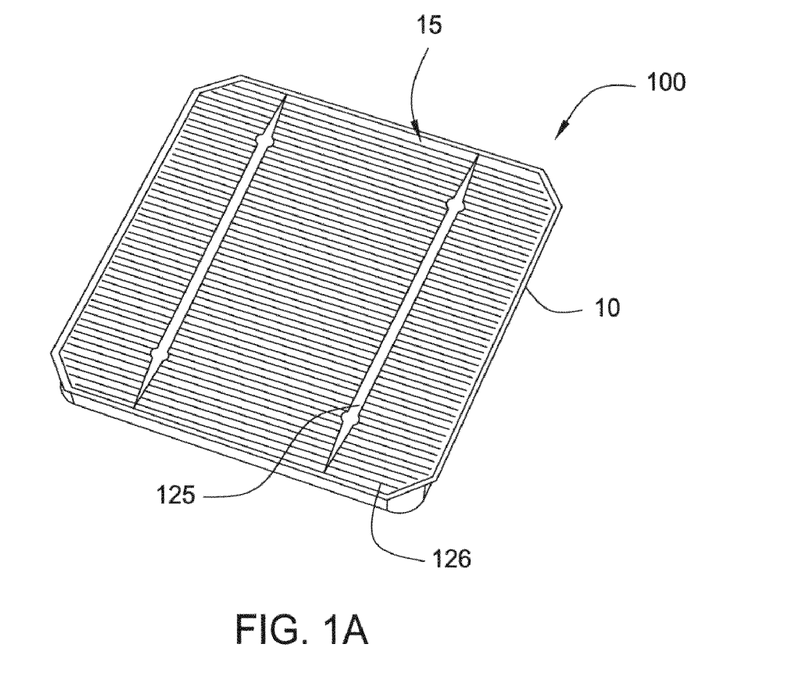
FIG. 1A illustrates an isometric view of a solar cell containing a front side metallization interconnect pattern.

The present invention generally provides a method and apparatus that is used to form a metalized structure on the front surface of a photovoltaic device. FIG. 1A illustrates the front surface of a formed solar cell device 100. The solar cell device illustrated in FIG. 1A has two buss bars 125 and plurality of regular grid lines 126 formed thereon to form an electrode grid that is used to collect current from a formed solar cell device 100. The electrical current generated by the solar cell when illuminated, flows through contacts disposed on the front surface 15, i.e. the light-receiving side, and the backside (not shown) of the solar cell 100. The top contact structure is generally configured as widely-spaced thin metal strips, or regular grid lines 126, that supply current to a larger buss bar 125. The back contact (not shown) is generally not constrained to be formed in multiple thin strips, since, except in special cases such as bifacial cells, the incident light does not strike the back surface of solar cell 100. The front surface 15 of the solar cell 100 is generally covered with a thin layer of dielectric material, such as $Si_3N_4$, to act as an anti-reflection coating, or ARC, to minimize light reflection from the top surface of solar cell 100. As noted above, when light falls on the solar cell, energy from the incident photons generates electron-hole pairs on both sides of a p-n junction region. Electrons diffuse across the p-n junction to a lower energy level and holes diffuse in the opposite direction, so that when an electrical circuit is made between the emitter and the base and the p-n junction is exposed to certain wavelengths of light, a current will flow.

One problem encountered in forming a solar cell device having an electrode grid, or a gridline type structure, is that the formed solar cells are prone to power loss due to the series resistance in the interconnected elements. A typical silicon solar cell has a bulk region (e.g., p-type silicon region) having a resistivity of about 1 ohm-cm. In cases where the bulk region is a p-type region, an n-type emitter may be diffused into the front surface of the substrate to form the p-n junction. Most of the current is collected in the bulk region of the substrate, although some of the current is collected in the emitter portion of the device. The current which is collected in the emitter flows within the emitter to the gridlines 126 and then out into the electrical circuit through the bus bars 125. If heavy doping of the emitter is utilized it will reduce the electrical resistance of the emitter layer. However, such heavy doping increases recombination losses in the emitter thereby reducing efficiency of the solar cell. Efficiency of the solar cell can also be lost by reducing the spacing of the gridlines 126, due to shadowing of the incident light. The gridlines 126 are typically two to three millimeters apart and are typically 50 to 100 microns wide and 10 to 15 microns thick. In some cases, gridlines 126 are made of a fired silver paste.

Figure 1B:
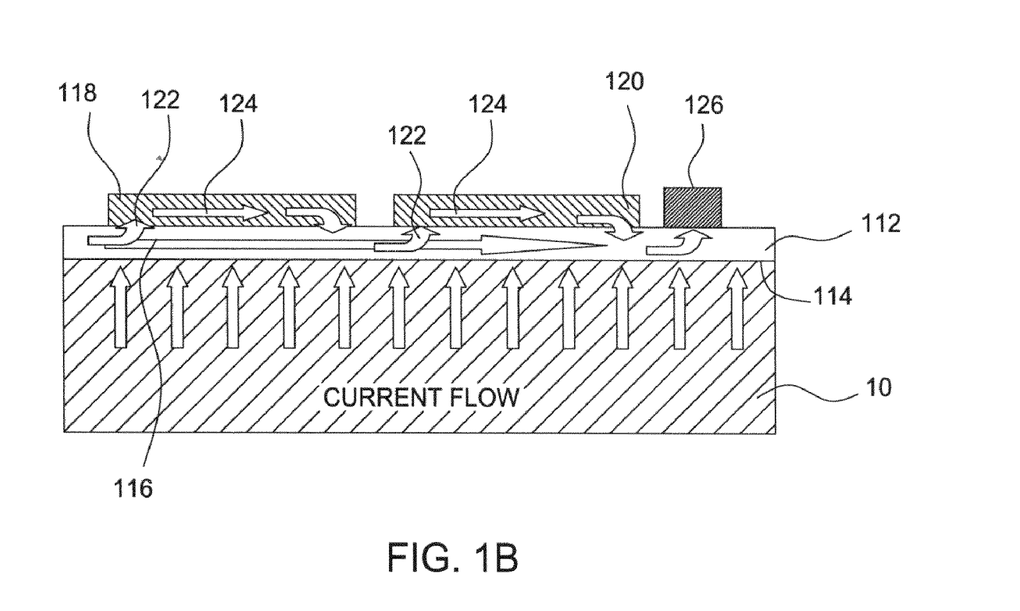
FIG. 1B is a schematic diagram illustrating the utilization of broken gridlines to lower the series resistance of the emitter of a silicon solar cell according to one embodiment of the invention.
Figure 1C:
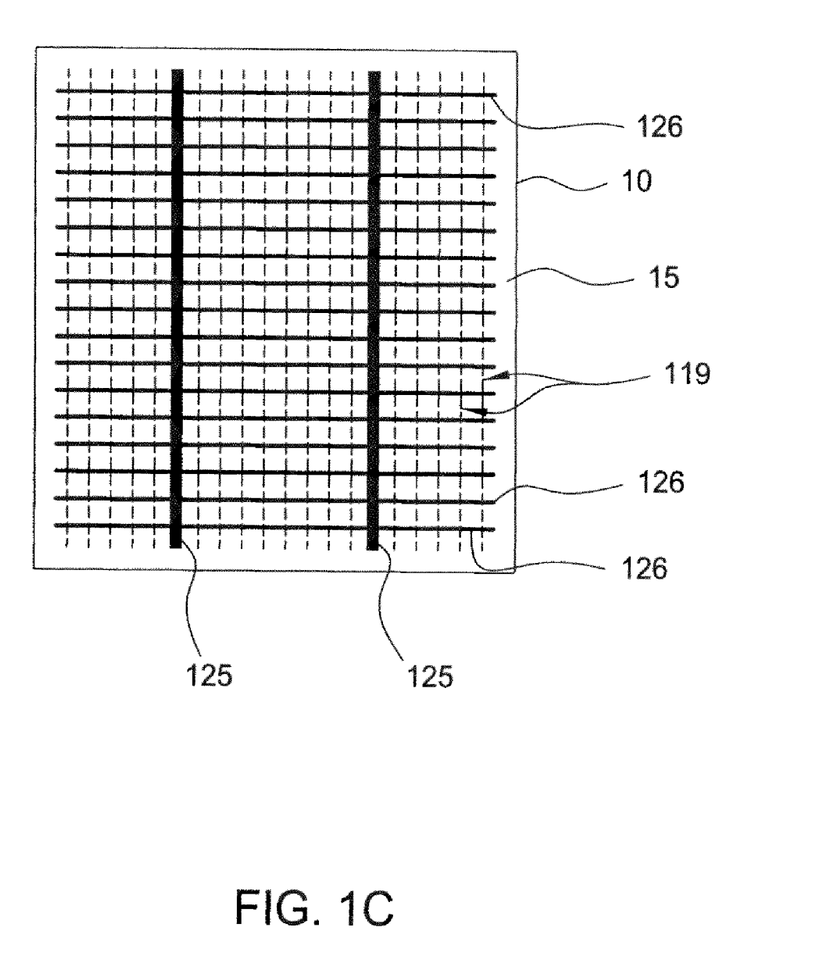
FIG. 1C illustrates a plan view of a solar cell containing a front side metallization interconnect pattern according to one embodiment of the invention.

It has been discovered that one way of reducing the emitter resistance, thereby allowing an increase in the gridline spacing, is to provide broken gridlines along the front surface of the silicon solar cell. The broken gridlines typically run perpendicular to the gridlines 126, and typically have narrower dimensions than the gridlines 126. For example, the broken gridlines 118, 120 may be ten microns wide and five microns thick. These lines can be screen printed through a printing mask with holes finer than the normal resolution of the screen printing process. In another embodiment, metal is plated is on the surface through a fine plating mask. The formed lines can even be narrower than the optical wavelength, so that light blocking is greatly reduced. Formation of such small lines is discussed below. These secondary or broken gridlines are not intended to conduct current directly to the gridlines and bus bars, but rather provide a low resistance path in parallel with the emitter, such is shown in FIG. 1B. Referring to FIG. 1B, the substrate 10 generally has an emitter layer 112 formed thereon, which forms one side of the p-n junction 114. The current that flows through the substrate 10 and emitter layer 112 (i.e., reference numeral 116) are shown by the plurality of arrows. The broken gridlines 118 and 120 are provided along the surface of the emitter and as shown some of the current passes from the emitter as illustrated at 122 and flows through the broken gridlines 118, 120 as shown at 124. This provides a parallel conducting path through the emitter 112. As a result of the parallel conducting paths, the overall resistance of the emitter 112 is thereby reduced and the efficiency of the solar cell is increased. It has been discovered that with a conventional grid structure (without the broken gridlines) the efficiency of the solar cell is approximately 18.5%. If the same cell is utilized with no emitter resistance the efficiency increases to 19.49%. A cell having broken gridlines that are spaced 3.8 mm apart provides an efficiency of 19.32%. It is thus realized that the broken gridlines even at a low density are able to nearly eliminate the effect of emitter resistance which otherwise degrades cell efficiency by about one percent absolute.

As noted above, the present invention generally provides a method and apparatus that is used to form a metalized structure on the front surface of a photovoltaic device. In one embodiment, a metalized structure is formed on the front surface of a substrate to form at least a portion of broken gridline structure which is used to improve the efficiency of the formed solar cell device. In another embodiment, a metalized structure is formed on the front surface of the substrate, which is used to in place of the gridline structure (e.g., reference numerals 126 in FIG. 1A), and thus provide current to one or more buss bars 125.

Figure 2A:
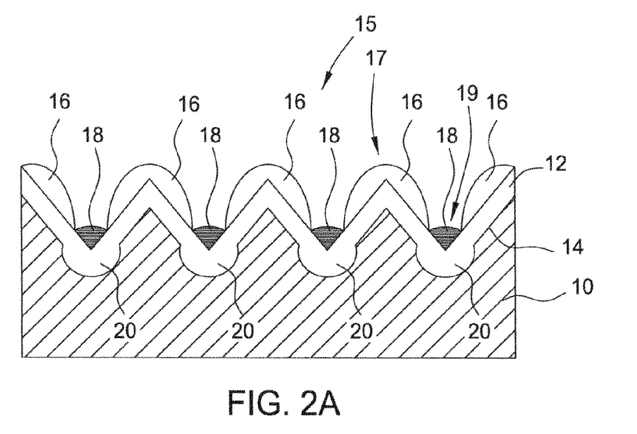
FIG. 2A is a schematic representation showing the gridlines formed on the textured front surface of a silicon semiconductor substrate according to one embodiment of the invention.
Figure 2B:
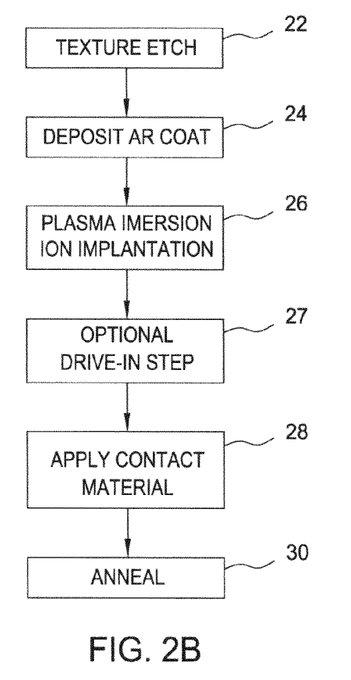
FIG. 2B is a flowchart illustrating a process of forming the structures shown in FIG. 2A according to one embodiment of the invention.

FIG. 2A is a schematic side cross-sectional view of a substrate 10, such as a crystalline silicon substrate, having front contacts formed according to one of the methods of the present invention. FIG. 2B is a flowchart diagram that illustrates the steps used to form a metalized structure that is shown in FIG. 2A. The substrate 10 is preferably constructed p-type silicon material that has an n-type emitter region 12 formed on the front surface 15 of the substrate to form a p-n junction 14. The front surface 15 of the substrate 10 is textured, by use of techniques that are well known in the art, to form the peaks 17 and valleys 19. An antireflective (AR) coating 16 is provided across the front surface of the substrate 10. The coating 16 may be, for example, a silicon nitride ($SiN_x$) material, or other well known antireflective coating material.

The emitter region 12 and AR coating 16 may be formed in many different ways. In one embodiment, the AR coating 16 consists of a thin (on the order of 200 Å) silicon dioxide layer doped with phosphorous on which a SiN$_x$ layer is deposited. Then the substrate 10 is then heated to approximately 850° C. so that the phosphorous in the oxide layer is driven into the substrate 10 to form the p-n junction 14. In another embodiment, the AR coating 16 is doped with an n-type dopant, for example, by the ion implantation of a phosphorus dopant to form an n-type emitter region 12 and the AR coating 16. In one example, the ion implantation is performed using a plasma ion immersion chamber (P3i) available from Applied Materials, Inc. of Santa Clara Calif. The implanted structure is then annealed by heating it to a temperature of approximately 840° C. for a period of thirty minutes to activate and drive in the dopants. In one embodiment, the doping process is performed using a spin-on type process, a liquid dopant source applied to the surface type process, or a gas source type doping process (e.g., furnace doping process).

Figure 2C:
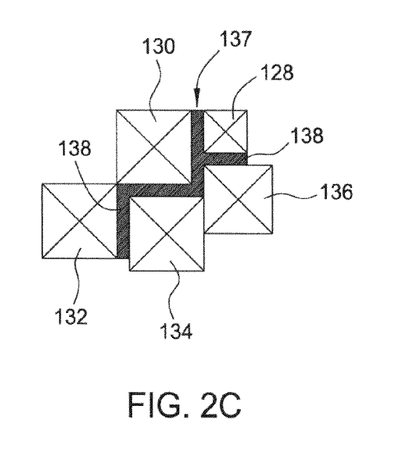
FIG. 2C is a schematic diagram illustrating a method for forming broken gridlines according to one embodiment of the invention.

FIG. 2C illustrates an embodiment of a broken gridline structure formed using the processes discussed herein in conjunction with FIGS. 2-9. FIG. 2C is a plan view of the top surface of a textured silicon substrate, which as a result of the texture etching process has a plurality of tetrahedrons 126-134 formed thereon. One will note that FIG. 2C only represents a small portion of the top surface of the substrate. By performing the various processing steps described below, an appropriate metallic contact material is formed in the valleys 135 between the tetrahedrons. In one embodiment, the formed submicron grid 136, which runs through the bases of the tetrahedrons 126-134, can be used to form a micro-pattern of broken gridlines, which are discussed above. In one configuration, the gridlines are a sub-wavelength in size (e.g., height and width), and thus provide small or no optical obscuration of the photons striking the top surface of the formed solar cell substrate. Through the utilization of this technique, the distance between the current carrying connection points is approximately 10 microns as opposed to the typical 1 mm in conventional processing. As a result, the series resistance will be reduced. Through the utilization of this micro-pattern for the broken grids, the gain is 0.5% absolute in light collection and approximately 0.5% absolute in the series resistance.

As is shown in FIG. 2B, in one embodiment, the basic steps for forming this structure as shown in FIG. 2A is to first texture etch the front surface of the substrate 10 using a convention etching chemistry (i.e., step 22). Thereafter, at step 24, the AR coating is deposited over the textured front surface 15. As above described, the AR coating 16 may be sputtered onto the front surface of the substrate 10. When such sputtering occurs the material will collect at the peaks 17 and the thickness of the deposited film will taper off toward the valleys 19, due to shadowing. In one embodiment, the sputtering process leaves the valleys 19, between the peaks 17, uncoated by the anti-reflective coating layer due to shadowing.

At step 26, an n-type dopant material which provides the emitter region 12 may be formed by plasma immersion ion implantation (P3i). The plasma immersion ion implantation can be accomplished by flowing an appropriate gas containing the doping material, such as phosphine in a hydrogen carrier, and then applying an appropriate electrical energy field to generate a plasma. The plasma creates phosphorous ions, which as a result of proper biasing of the substrate 10, will bombard the front surface 15 thereof. As is well known the SiN$_x$ antireflective coating 16 will act as a mask, but since the AR coating 16 (e.g., SiN$_x$) does not cover some regions in the valleys a substantial amount of ion implantation will occur in those areas which is used to form the heavily doped regions 20. In one example, a heavily doped n+ region is formed within the heavily doped regions 20. During the plasma immersion ion implantation process, some of the phosphorus atoms will be absorbed by the antireflective coating 16. In one embodiment, the doping process is performed using a spin-on type process, a liquid dopant source applied to the surface type process, or a gas source type doping process (e.g., furnace doping).

Next, an optional drive-in step, or step 27, is performed to cause the phosphorous atoms contained in the AR coating 16 to diffuse from that AR coating 16 into the upper surface of the substrate 10 to form the emitter 12. The implanted structure is then annealed by heating it to a temperature of approximately 840° C. for a period of thirty minutes which will also activate and drive in the dopants.

Next, after performing the implantation step (step 26), then a coating of the metallic material, such as nickel (Ni) may be applied at step 28 to form contact points 18. The contact material is applied to the front surface 15 of the substrate 10 in such a manner that it occupies the valleys 19 in the textured front surface as is illustrated at reference numeral 18, which can be used to form the gridlines for the front surface of the silicon solar cell. The contact material may be nickel which is plated or sputtered on to the surface of the substrate. In one example, nickel may be electroless plated directly onto the exposed silicon, and then alloyed to form nickel silicide contact. An example of an electroless deposition processes and chemistries that may be advantageously used to form the metalized contact points 18 are further discussed in the commonly assigned and copending U.S. patent application Ser. No. 11/553,878, filed Oct. 27, 2006 and the commonly assigned U.S. patent application Ser. No. 11/385,043, filed Mar. 20, 2006, which are both herein incorporated by reference in their entirety. In one example, the electroless nickel deposition process is performed using an electroless solution that contains: nickel sulfate with a concentration of about 60 mM; dimethylaminoborane (DMAB) in a concentration of about 14 mM; citric acid in a concentration of about 60 mM; diethanolamine (DEA) in a concentration of between about 33 mM and about 115 mM; glycine in a concentration between about 5 mM to about 50 mM; boric acid in a concentration between about 5 mM and about 10 mM; lactic acid in a concentration of about 120 mM; tetramethyl ammonium hydroxide (TMAH) in a concentration to adjust the electroless solution to a have pH value in a range from about 8 to about 11, preferably from about 9 to about 10, and more preferably from about 8.0 to about 8.5, such as about 8.5. The electroless deposition process may be conducted at a temperature in a range from about 35° C. to about 120° C., preferably from about 80° C. to about 85° C. In one example, DI water may be preheated and degassed (e.g., less than about 100 ppm) to reduce the oxygen concentration in the subsequently formed electroless solution. Preheating the water to an intermediate temperature allows an electroless solution to be formed at a predetermined temperature, which is just below the temperature used to initiate the deposition process, to shorten the deposition process time.

In another embodiment of step 26, a very thin Ni layer (on the order of 100 Å) is sputtered on the front surface 15 and heated to form a nickel silicide layer at the exposed regions on the surface 15 so that the metalized contact points 18 can be formed. The excess nickel disposed on the AR coating 16 then can be etched off in an aqua regia, nitric acid (HNO$_3$) solution, or pirannah (sulphuric acid and hydrogen peroxide) chemistry, and a thicker metal layer that may contain silver is then electrolessly plated on the exposed nickel silicide layer.

In one embodiment of step 28, an additional layer of a conductive material is then deposited with the bulk of the conductive material being formed in the valleys 19, to form an interconnected gridline structure using the formed contact points 18 as a base. In one embodiment, the additional layer is formed by use of a plating process. The additional layer of material may comprise silver, nickel, copper, aluminum or other similar material. As noted above, it may be desirable to remove the portions of the additional layer, which is disposed on the outer surface of the antireflective layer 16 by etching this unwanted material. An etching material that can be used will preferably include nitric acid ($HNO_3$) or other desirable etching solution, as appropriate for the metal to be etched.

Next, in step 30, the substrate 10 is annealed to form a desirable electrical connection between the contact material formed from the interconnected contact points 18 and the heavily doped region 20 in the substrate. As will be recognized by those skilled in the art through the utilization of the method as described above, a gridline structure that can be used to form a front contact on the substrate 10 has been formed without the utilization of any patterning as is normally is the case utilizing prior art techniques. Subsequent to the manufacture of the structure as shown in FIG. 2A and as described above, the bus bars which are well known in the art may be screen printed on the front surface 15 to collect the current generated in the solar cell when the photons of light strike the solar cell device. The current can thus be collected by passing current between formed interconnected gridline structure and the buss bars.

Alternate Processing Method

FIGS. 3A-3G illustrate an alternate method of forming the gridlines according to one embodiment of the invention. FIGS. 3A-3G generally illustrates a series of side close-up cross-sectional views of a portion of a front surface 15 of a substrate 10 at different times or stages of a processing sequence 400 illustrated in FIG. 4. As shown in FIGS. 3A-3G, a single valley 19 having two surfaces 34 and 36 is formed between two peaks 17, which are all part of the texture etched front surface 15 of a substrate 10.

Figures 3A, 3B, 3C, 3D:
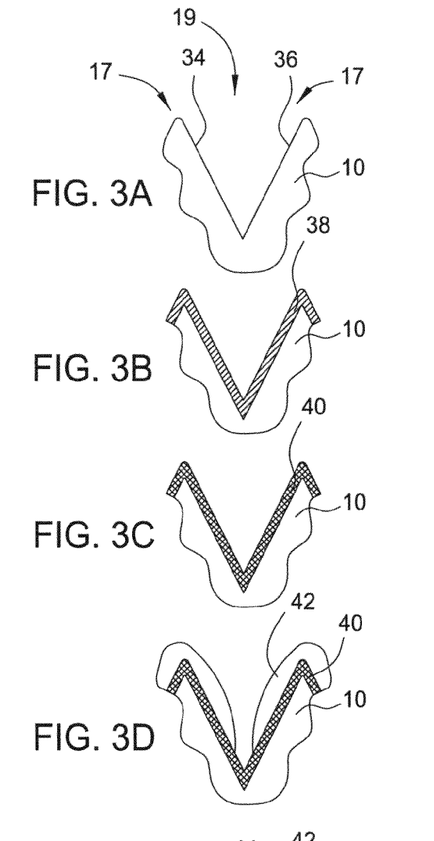
FIG. 3A-3G illustrate schematic cross-sectional views of a structure during different stages of the process sequence described in conjunction with FIG. 4 according to one embodiment of the invention.
Figure 4:
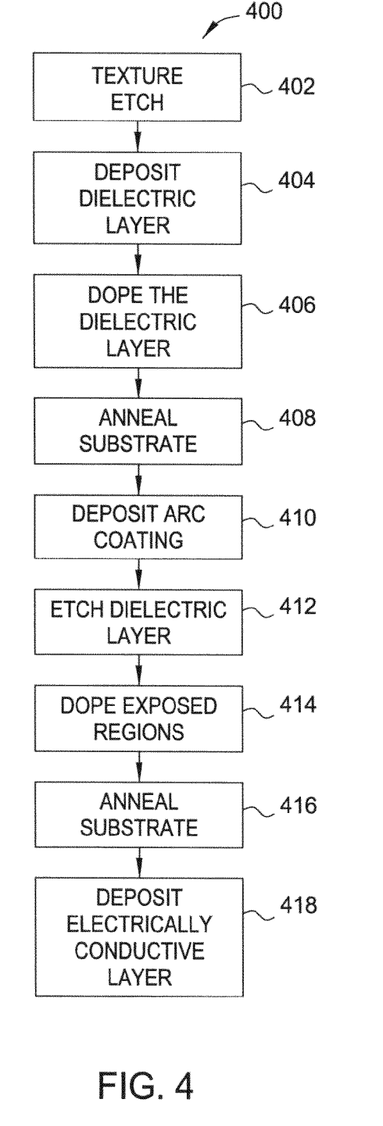
FIG. 4 is a flowchart illustrating a process of forming the structures shown in FIGS. 3A-3G according to one embodiment of the invention.

Referring to FIGS. 3A and 4, at step 402 the surface of the substrate 10 is texture etched to form a valley 19. As noted above the texture etch process may be performed using a conventional texture etching process to form a random pyramidal type structure (e.g., tetrahedrons) on a surface of the substrate 10, which is well known in the art.

Next, a dielectric layer 38, as shown in FIG. 3B, is formed on the surfaces 36 and 34 of the substrate during step 404. In one example, the dielectric layer 38 is a $SiO_2$ layer that is formed by use of a chemical vapor deposition (CVD) process, as is well known in the art.

During step 406, as shown in FIG. 3C, the dielectric layer 38 is then doped with appropriate doping material, such as an n-type dopant (e.g., phosphorus), to form a doped dielectric layer 40. The doping process may be performed through the use of a plasma immersion ion implantation process, or other similar process, as above-described. In one embodiment, the doping process is performed using a spin-on type process, a liquid dopant source applied to the surface type process, or a gas source type doping process (e.g., furnace doping).

At step 408, the substrate is then annealed to diffuse and drive-in the dopant atoms (e.g., phosphorus atoms) into the substrate 10 to form an emitter layer 40 (e.g., n-type emitter). The annealing process may generally include heating the substrate to a temperature of approximately 800° C. for a period of thirty minutes.

At step 410, and as shown in FIG. 3D, an anti-reflective coating 42, such as $SiN_x$, is deposited on the surface of the emitter layer 40. In one example, a silicon nitride coating that is about 200 Å thick is deposited over the emitter layer 40 by use of a sputtering process.

Figure 3E:
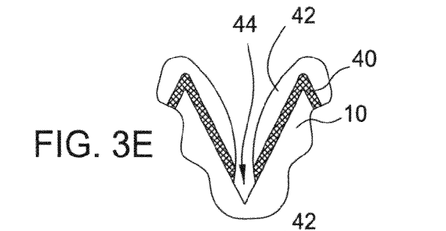

At step 412, after depositing the anti-reflective coating 42, the upper surface of the substrate is subjected to a buffered HF (diluted 50:1) etch which is used to remove the $SiO_2$ layer in the valley 19, thereby forming exposed regions 44 on the surfaces 36-34 of the silicon substrate 10.

Figure 3F:
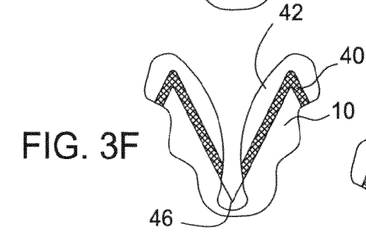

Next, during step 414, an additional doping material (e.g., n-type dopant) is then applied to the substrate 10 to form a heavily doped region 46. In one embodiment, the doping process is performed by use of a plasma immersion ion implantation process, or other similar processes, such as spin on glass (SOG).

At step 416, the substrate is then annealed to diffuse and drive-in the dopant atoms (e.g., phosphorus atoms) into the substrate 10 to form a heavily doped region 46 (e.g., n+-type region). The annealing process may generally include heating the substrate to a temperature of approximately 800° C. for a period of thirty minutes.

Figure 3G:
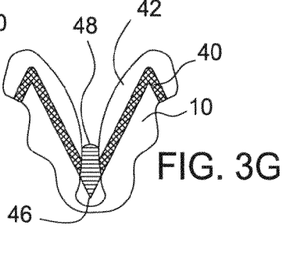

Thereafter, at step 418, an appropriate electrically conductive metal layer 48 is formed over the heavily doped region 46. The electrically conductive metal layer 48 may be formed by sputtering or plating, as discussed above. In one example, the electrically conductive metal layer 48 is a nickel containing material that is applied to the area 44. In one embodiment, an additional layer of a conductive material is then deposited over the conductive metal layer 48 to form an interconnected gridline structure. As also noted above, subsequent to performing step 418, bus bars may be screen printed on the front surface 15 to collect the current generated in the solar cell when photons of light strike the front surface of the solar cell device. In one configuration, the current can be collected by passing current between formed interconnected gridline structure and the buss bars. In another configuration, the current can be collected by passing current between formed broken gridline structure, emitter layer and the buss bars.

Second Alternate Processing Method

Figure 5:
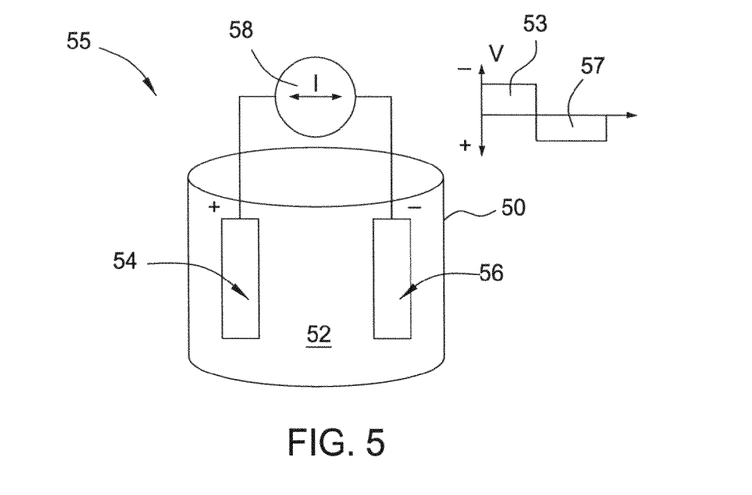
FIG. 5 is a schematic diagram of hardware for generating gridlines in the valleys of a textured surface by placing the contact material according to one embodiment of the invention.
Figure 6:
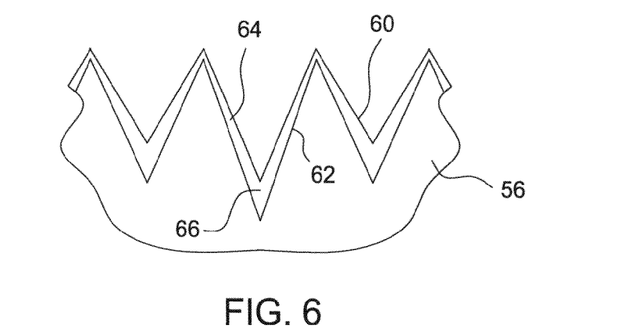
FIG. 6 is a schematic representation of the textured front surface of a silicon semiconductor substrate after plating the contact material according to one embodiment of the invention.
Figure 7:
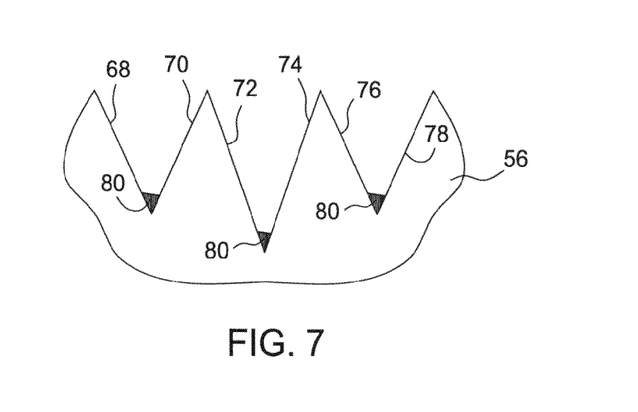
FIG. 7 is a schematic representation of the textured front surface of a silicon semiconductor substrate after being etched back leaving the contact material in the valleys formed by the surface texturing according to one embodiment of the invention.

An alternative method for forming the interconnected gridlines in the valleys of a textured surface on a crystalline silicon solar cell substrate is shown in FIGS. 5, 6 and 7 to which reference is now made. FIG. 5 illustrates a conventional plating chamber 55 that can be adapted to form the gridlines on a textured substrate. Prior to inserting the substrate 56 in the plating chamber 55 a conductive layer, or seed layer, is deposited on the textured front surface 62, by use of a conventional deposition technique such as PVD, CVD, evaporation or other similar technique. In one embodiment, the seed layer comprises a material that is similar to the layer that is to be plated on the surface of the substrate in the subsequent steps. In one example, the deposited seed layer is made from a metal selected from the group consisting of silver, nickel, copper, tin, aluminum or other similar material. As is illustrated, a container 50 having an electrolyte bath 52 of a plating solution is provided. An electrode 54 of nickel or other suitable conductive material is supported in the container 50 and is connected to a first terminal of a source of electrical energy 58. The second terminal of the source 58 is connected to the substrate 56. As the current flows in a forward direction 53 (e.g., substrate is cathodic) a plated layer 60 forms on the seed layer disposed on the textured front surface 62 of a semiconductor substrate 56. It should be noted that the thickness of the plated material 60 will generally be greater in the valleys than at the peaks of the textured surface, as illustrated at region 64 and region 66. Plating inhibitors and chemicals may be added to the electrolyte solution to further enhance this "superfill" effect, as is well known in integrated circuit processing to form damascene structures. The plating current is then reversed 57 (e.g., substrate is anodic), so that an etching process occurs and an amount of the plated material 60 is removed from the surfaces 68-78 (FIG. 7) of the substrate 56. It is believed that by use of a relatively high reverse plating current density the plated material can be preferentially removed from the peaks of the textured front surface 62 rather than the valleys 80. A desirable plating current that will preferentially removed from the peaks of the textured front surface 62 will generally vary with the electrolyte conductivity, fluid dynamic properties of the plating chamber 55, an the conductivity of the deposited film that is to be removed. In one aspect, one or more conventional additives may be added to the electrolyte (e.g., inhibitors, accelerators, levelers, brighteners) to promote the preferential etching of the plated material 60. The plated material 60 then only remains in the valleys 80, and thus forms the grid structure for the solar cell. The appropriate additional steps of forming the p-n junction and providing the antireflective coating and the n+ regions as above-described are carried out after which the appropriate bus bars are screen printed in place.

Third Alternate Processing Method

In accordance with yet another embodiment of the present invention, reference is made to FIGS. 8A-8D and 9. FIGS. 8A-8D generally illustrate a series of side close-up cross-sectional views of portions of a substrate 10 having a single valley 19 that is formed between surfaces 84 and 86 by use of a texture etch process. Step 902 is generally similar to step 402 discussed above.

Figure 8A:
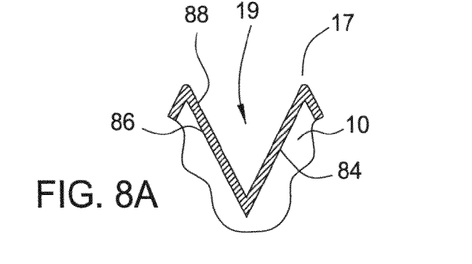
FIG. 8A-8D illustrate schematic cross-sectional views of a structure during different stages of the process sequence described in conjunction with FIG. 9 according to one embodiment of the invention.
Figure 9:
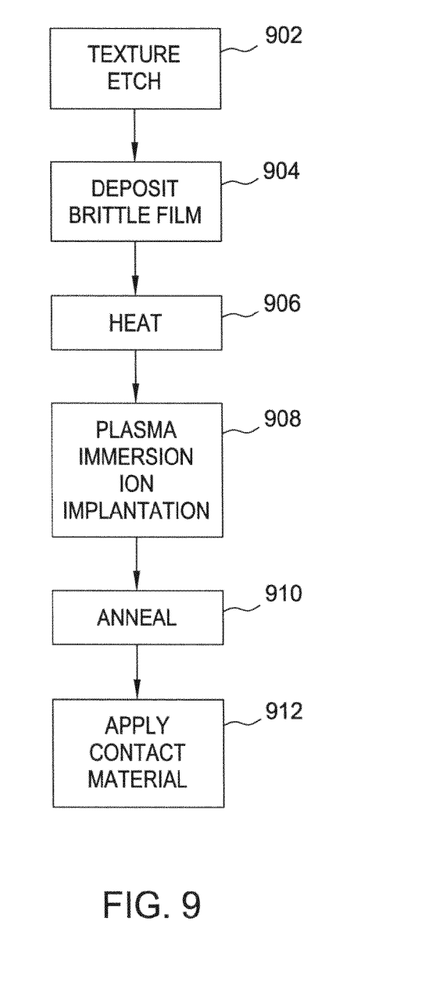
FIG. 9 is a flowchart illustrating a process of forming the structures shown in FIGS. 8A-8D according to one embodiment of the invention.

During step 904, as shown in FIGS. 8A and 9, a brittle film 88 is applied to the surfaces 86 and 84 of the texture etched substrate 10. The brittle film 88 may comprise a film that contains, for example, silicon dioxide ($SiO_2$), silicon nitride ($Si_3N_4$) or a carbon containing film (e.g., silicon carbide (SiC)). This deposited brittle film 88 can, for example, be SiN deposited by plasma enhanced chemical vapor deposition in a $H_2$ rich environment at a temperature between 300° and 500° C. By depositing the layer 88 at these low temperatures, the atoms do not have the mobility to move after they land on the surface of the substrate, and thus tend to form a brittle layer. In one embodiment, the brittle film 88 is deposited at a temperature that causes the brittle film 88 to crack when it is cooled, due to stress created in the film by thermal compression.

Figure 8B:
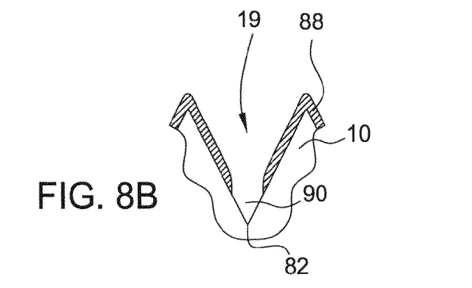

Next at step 906, as shown in FIG. 8B, the substrate 10 with the brittle film 88 deposited thereon is then heated, or exposed to UV light, to drive out the hydrogen contained within the formed layer. This process creates a tension in the brittle film 88 (e.g., $Si_3N_4$) causing it to crack along the bottom of valley 19, to create an exposed area 82 containing a portion of the surfaces 86 and 84. If desired, after the cracks 90 are formed, the surface may be subjected to an HF diluted 6:1 buffered etch to etch the deposited film and expand the cracks 90. The removal of portions of the brittle film 88 can thus form larger openings through, which the doping atoms delivered in the next step can pass.

Figure 10:
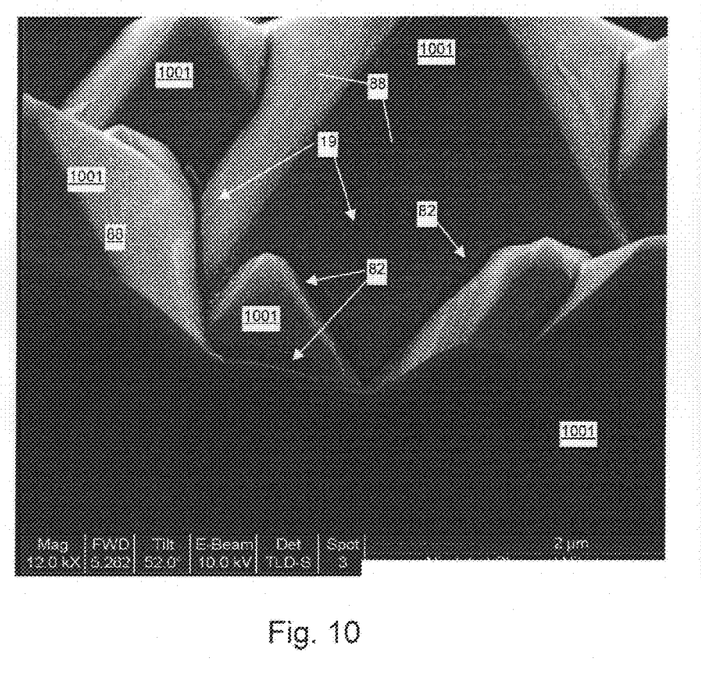
FIG. 10 is a scanning electron microscope picture of a portion of a textured front surface of a substrate having an anti-reflection coating formed thereon that has a plurality of exposed areas formed in a plurality of valleys using the processes described herein according to one embodiment of the invention.

FIG. 10 is a close-up scanning electron microscope picture of a portion of a textured surface of a substrate that has a brittle film 88 (e.g., silicon nitride) formed on a plurality of tetrahedrons 1001. As shown in FIG. 10, formed cracks in the brittle film 88 create a plurality of exposed regions 82 that are formed in the valleys 19 between the plurality of tetrahedrons 1001.

Figure 8C:
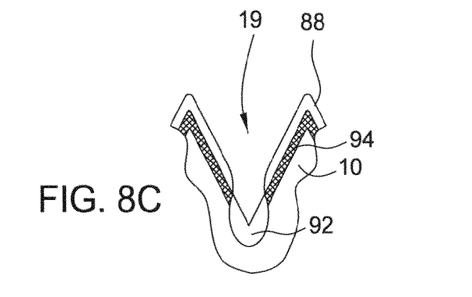
Figure 8D:
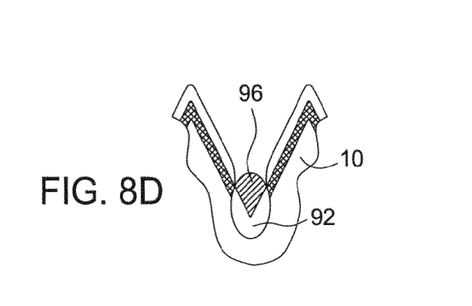

At step 908, as shown in FIG. 8C, the exposed areas 82 are then doped to form a heavily doped region 92. In one example, the dopant is phosphorous assuming that the substrate 10 is a p-type substrate. The doping can be accomplished through the plasma immersion ion implantation (P3$i$) process or other well known diffusion techniques. The phosphorous ions may be absorbed by the $Si_3N_4$ layer 88, but are principally absorbed by the silicon substrate through the crack 90.

At step 910, as shown in FIG. 8C, the silicon substrate 10 with the phosphorous ions contained therein is annealed causing the formation of a heavily doped region 92 (e.g., n+ region) within the valley 19 and at the same time the phosphorous atoms absorbed by the $Si_3N_4$ layer diffused into the surface of the substrate to form an emitter layer 94 (e.g., n-type emitter). In an alternate embodiment, the $Si_3N_4$ layer can be phosphorous doped during the deposition process to provide an additional amount of phosphorous to help form the p-n junction. As discussed above, in one embodiment, the $Si_3N_4$ layer can be deposited over a thin phosphorous doped layer of $SiO_2$ prior to performing step 904. In some cases, this method may be used to provide additional phosphorous doping, as phosphorous diffuses much faster in $SiO_2$, so that more is available to dope the silicon.

Thereafter, at step 912 (FIG. 8D), an electrically conductive contact material 96 is applied to the heavily doped region 92 to provide the gridlines, as similarly discussed above. The electrically conductive contact material 96 may be applied by plating, sputtering or the like, as is well known in the art. As above described, the bus bars may be then formed along the top surface to complete the electrical contact to the top surface of the solar cell.

Figure 11:
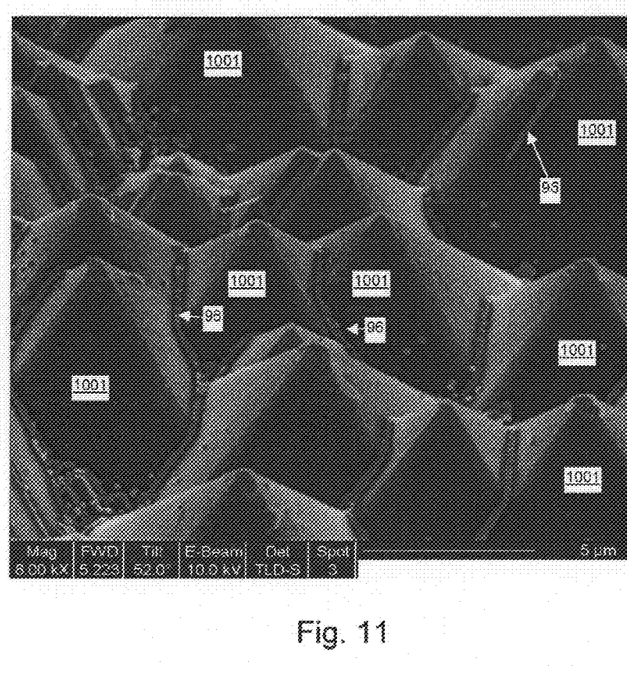
FIG. 11 is a scanning electron microscope picture of a portion of a textured front surface of a substrate having an electrically conductive contact material disposed in the exposed areas that are formed using the processes described herein according to one embodiment of the invention.

One will note that the previously described methods may also be used to form a series of fine gridlines at the base of the tetrahedrons formed during the texturing process (FIG. 2C). In another embodiment, the series of fine grid lines need not be continuous, as they can be used to form a set of broken grid lines that provide a low resistance path in parallel to the doped emitter. FIG. 11 is a close-up scanning electron microscope (SEM) picture of a portion of a textured surface of a substrate that has a layer of the electrically conductive contact material 96 formed within the exposed regions 82 found in the valleys 19 formed between the tetrahedrons 1001. As shown the electrically conductive contact material 96, or in this case a formed nickel layer, follows the valleys 19 formed between each of the plurality of tetrahedrons 1001 that are coated with the brittle film 88.

There has thus been disclosed a silicon solar cell which has formed thereon gridlines which are provided without patterning.

While the foregoing is directed to embodiments of the present invention, other and further embodiments of the invention may be devised without departing from the basic scope thereof, and the scope thereof is determined by the claims that follow.

What is claimed is:

1. A method for forming electrically conductive paths on a surface of a crystalline solar cell without patterning comprising:
   texturizing a surface of a substrate to form peaks and valleys;
   forming an antireflective layer over the surface, wherein at least a portion of the surface in the formed valleys is not covered by the formed antireflective layer;
   diffusing a doping material into the at least a portion of the surface that is not covered by the formed antireflective layer;

depositing an electrically conductive material on the at least a portion of the surface not covered by the formed antireflective layer; and heating the substrate to a desired temperature.

2. The method as defined in claim 1, wherein the formed antireflective layer has a tensile stress.

3. A method as in claim 2, where the antireflective layer is a brittle film that is deposited by plasma-enhanced chemical vapor deposition in a hydrogen-rich environment at a temperature between 300° C. and 500° C.

4. The method as defined in claim 3, which includes the further step of removing hydrogen contained within the antireflective layer, thereby causing the antireflective layer to crack within the valleys.

5. A method as defined in claim 4, which includes the further step of etching the surface of the solar cell to enlarge the cracks.

6. The method as defined in claim 1, further comprising:

forming a plurality of tetrahedrons during the texturizing of the surface of the substrate; and the depositing the electrically conductive material comprises depositing the metallic contact material between the formed tetrahedrons to provide a micropattern of broken gridlines.

7. A method as defined in claim 6, wherein the metallic contact material is sputtered onto the tetrahedrons.

8. The method as defined in claim 6, wherein the metallic contact material is plated onto the tetrahedrons.

9. The method as defined in claim 1, wherein the antireflective layer is formed by a process selected from the group consisting of chemical vapor deposition and sputtering.

10. The method as defined in claim 1, wherein the doping material is applied by use of a plasma immersion ion implantation process.

11. The method as defined in claim 1, wherein the doping material is delivered from a gas or liquid phase source.

12. A method as defined in claim 1, wherein the electrically conductive material is deposited by plating.

13. A method as defined in claim 1 wherein the electrically conductive material is deposited by sputtering.

14. A method as defined in claim 1, wherein the crystalline solar cell is p-type material and the doping material is phosphorus.

15. The method as defined in claim 1, further comprising forming broken gridlines on the face of the solar cell in parallel with but substantially not electrically connected to the electrically conductive material.

16. A method for forming electrically conductive paths on a face of a crystalline solar cell without patterning comprising:

texturizing the face of a substrate to form peaks and valleys;

forming a dielectric layer over the face;

forming an antireflective layer over the doped dielectric layer, wherein at least a portion of the dielectric layer is not covered by the formed antireflective layer;

etching a portion of the dielectric layer so that a portion of the face in the valleys is exposed;

diffusing a doping material into the portion of the face; and depositing an electrically conductive material on the portion of the face.

17. The method as defined in claim 16, wherein the formed antireflective layer has a tensile stress.

18. The method as defined in claim 16, wherein the doping material is applied by use of a plasma immersion ion implantation process.

19. A method as defined in claim 16, wherein the electrically conductive material is deposited by plating.

20. The method as defined in claim 16, further comprising forming broken gridlines on the face of the solar cell in parallel with but substantially not electrically connected to the electrically conductive material.

21. A method for forming electrically conductive paths on a surface of a crystalline solar cell without patterning comprising:

texture etching the surface of the solar cell to provide peaks and valleys;

plating an electrically conductive material onto the textured surface; and reversing the plating current to preferentially remove the plated electrically conductive material from the peaks and leave an amount of the electrically conductive material in the valleys of the textured surface.

22. The method as defined in claim 21, which further includes diffusing a doping material into the surface.

* * * * *

UNITED STATES PATENT AND TRADEMARK OFFICE
CERTIFICATE OF CORRECTION

| | | |
|---|---|---|
| PATENT NO. | : 7,820,472 B2 | Page 1 of 1 |
| APPLICATION NO. | : 12/291917 | |
| DATED | : October 26, 2010 | |
| INVENTOR(S) | : Borden et al. | |

It is certified that error appears in the above-identified patent and that said Letters Patent is hereby corrected as shown below:

In the Detailed Description:

Column 6, Line 49, please delete "D1" and insert --DI-- therefor.

Signed and Sealed this
Eighth Day of March, 2011

David J. Kappos
*Director of the United States Patent and Trademark Office*